US007087281B2

(12) United States Patent
Steckl et al.

(10) Patent No.: US 7,087,281 B2
(45) Date of Patent: Aug. 8, 2006

(54) DIELECTRIC THIN-FILM COLOR OPTICAL MEMORY DEVICE AND FABRICATION PROCESS

(75) Inventors: Andrew J. Steckl, Cincinnati, OH (US); Robert Chih-Jen Chi, Thousand Oak, CA (US)

(73) Assignee: University of Cincinnati, Cincinnati, OH (US)

( * ) Notice: Subject to any disclaimer, the term of this patent is extended or adjusted under 35 U.S.C. 154(b) by 570 days.

(21) Appl. No.: 10/262,061

(22) Filed: Sep. 30, 2002

(65) Prior Publication Data

US 2003/0063487 A1    Apr. 3, 2003

Related U.S. Application Data

(60) Provisional application No. 60/326,482, filed on Oct. 2, 2001.

(51) Int. Cl.
*B32B 3/02*    (2006.01)
(52) U.S. Cl. ............... 428/64.1; 428/64.4; 430/270.12
(58) Field of Classification Search ............... 428/64.4; 430/270.12
See application file for complete search history.

(56) References Cited

U.S. PATENT DOCUMENTS

| 5,567,573 A | 10/1996 | Morton |
| 5,568,555 A | 10/1996 | Shamir |
| 5,635,114 A | 6/1997 | Hong |
| 5,700,539 A | 12/1997 | Hong |
| 5,773,116 A * | 6/1998 | Lamartine et al. ......... 428/64.1 |
| 6,230,071 B1 * | 5/2001 | Lamartine .................. 700/166 |
| 6,583,933 B1 * | 6/2003 | Lamartine .................. 359/567 |

OTHER PUBLICATIONS

Chi, C.J. and Steckl, A. J., "Digital thin-film color optical memory," Applied Physics Letters 78:2, pp. 255-257, Jan. 8, 2001.
Chi, Robert Chih-Jen, Dissertation, Optical memory device using vertical-interference from digital thin films, dated Mar. 27, 2001.

* cited by examiner

*Primary Examiner*—Elizabeth Mulvaney
(74) *Attorney, Agent, or Firm*—Frost Brown Todd LLC

(57) ABSTRACT

The DTF optical memory makes use of the property of dielectric thin film interference to create multi-color pixels and serve as a multi-level optical memory device. The fabrication of the device comprises a dielectric thin film deposited on a substrate that is micro-milled utilizing focused ion beam (FIB) technology. Such micro-milling creates pixels of varying depth that when exposed to a broad-band light source create distinct colors caused by the properties of thin film interference and superposition of reflected light from the broad band source, thus creating an effective optical memory device that may be detected using a color CCD camera or a photo-detector array. Accurate creation and detection of discrete colors allows accurate digital encoding and direct storage of color image in a format of sub-micron pixel array. The robustness of the DTF optical memory device allows operation under harsh environmental conditions, including high temperatures and radiation.

30 Claims, 5 Drawing Sheets

(a)

DIELECTRIC THIN-FILM COLOR OPTICAL MEMORY DEVICE AND FABRICATION PROCESS

CROSS REFERENCE TO RELATED APPLICATIONS

The present application hereby claims the benefit of the U.S. provisional patent application of the same title, Ser. No. 60/326,482, filed on 02 Oct. 2001.

FIELD OF THE INVENTION

The present invention pertains to an optical memory device. More particularly, it pertains to an optical memory device utilizing digital thin-film ("DTF") optical memory. Even more particularly, it pertains to an optical memory device utilizing DTF optical memory whereby localized regions of varying thickness of the thin-film adjust the spectral characteristics of reflected light from a broad band light source and the process of fabricating such DTF optical memory device.

BACKGROUND OF THE INVENTION

The next generation of optical memory is seeking to provide advances in capacity, data density, and data security. One such technology is the multi-layer CD-ROM structure. The multi-layer structure provides a data storage capacity multiplier according to the number of layers. The fabrication process of multi-layer structure requires multiple steps of data transfer and layer bonding process. Due to the requirements of addressing each layer without cross talk, the separation between layers can be as much as 30 microns. This translates into a requirement for an optical system with long focal length that can address the widely separated layers. However, in order to obtain high storage density in each layer, a smaller laser spot size and higher numeric aperture ("NA") objective are required. In turn, the higher NA yields a smaller depth of focus ("DOF"). This combination of effects leads to the limit of a small number of layers that are possible with this memory structure thus reducing its overall capacity. In order to increase the overall capacity, vertical bit-to-bit separation needs to be reduced significantly.

Another multi-layer approach for an optical memory structure uses a stack of metal thin films, with up to eight layers, each layer 5 to 30 nanometers ("nm") thick. In this structure, up to 256 shades of gray intensity represent eight bits of information. Due to the strong optical reflection characteristic properties of metals and the difficulty of controlling metal thin film deposition precision in one nanometer (nm) or less, only a small number of layers are realistic. Otherwise, the gray scale quantum step would be too small to obtain a good signal-to-noise ("S/N") ratio margin and the bit error rate ("BER") would be too high to meet the requirement of a computing memory. This approach is only suitable for producing a gray scale micro-picture for direct eye viewing (where a high BER is tolerable), instead of computing data applications.

Other optical memory devices attempting to use color as memory utilizing "colorants" such as color matter, color ink, colored plastic films, or color photographic system are known in the art. The detection system uses color detectors (strictly speaking, bandpass detectors) to detect the individual passband intensity and a complex computation process to extract data. For each colorant, there has to be a passband corresponding to it. A combination of different colorants in a cluster is called a "super-pixel" (which is several square micron in size) and is used as an optical access spot unit. The shortcomings of this invention include the aging of the memory colorant, the small practical number of colorants usable due to the broad optical bandwidth of the colorant and the difficulties in fabrication of the super-pixel with small size.

Consequently, a significant need exists for a high density optical storage device that stores multiple of bits of data per pixel at an accuracy level suitable for digital processing.

BRIEF SUMMARY OF THE INVENTION

The invention overcomes the above-noted and other deficiencies of the prior art by providing a Digital Thin Film (DFT) optical memory device that achieves increased density storage that is suitable for digital memory storage.

To achieve the forgoing and other objects, and in accordance with one aspect of the present invention, there is provided a dielectric DTF optical memory device comprising dielectric thin films on a substrate, for example, silicon dioxide ("$SiO_2$") thin film thermally grown on a silicon ("Si") substrate. The DTF optical memory device makes use of the property of dielectric thin film interference to create multi-color data location elements ("pixels") and serve as a multi-level optical memory device. The pixel color is determined by the thickness of dielectric thin film and by the spectral characteristic of the incident light profile and the detector. Multiple colors are achieved by creating discrete dielectric film thickness levels to modulate the reflectance and/or transmittance over a wide range of wavelengths. The combined effect of the broadband modulation of reflectance and/or transmittance causes a non-absorptive dielectric thin film pixel to appear to the human eye to be in color. This can be detected using a color charge-coupled device ("CCD") camera or a photo-detector array. The data is encoded using the thickness of the pixel film. By detecting the color of the corresponding pixel, the digital data can be decoded and extracted.

The DTF optical memory devices of the present invention are generally capable of operation in extreme environmental conditions. The robustness of some dielectric films and substrates allows operation of the DTF optical memory device under harsh environments, including temperatures as high as 1000° C. In combination with non-contact optical read techniques, the DTF memory ensures the data can be preserved over an exceedingly long time, maybe up to centuries.

The color capacity of the DTF optical memory devices herein can enable the direct storage of color images in the format of a sub-micron pixel array. Thus, the illustrative embodiment has advantages in addition to pure data storage for data processing. However, it will be appreciated that applications of the present invention may include use of "colors" outside of the visible optical spectrum. In particular, the data storage capabilities of the present invention are also applicable toward the ultraviolet (UV) band, infrared (IR) band, as well as into the microwave or X-ray bands. Bands other than the visible optical band may have advantages for inconspicuous authentication purposes, machine sensing advantages, enhanced data density, etc. For each wavelength, a suitable non-absorptive material would be selected with selected discrete thicknesses and sizing of local regions appropriate for the frequency band.

There is also provided a process of fabricating an ultra-high density dielectric DTF optical memory device comprising using dielectric thin films on a substrate whereby the thin films are micro-milled to different discrete depth levels using focused ion beam (FIB) technology. Such process will result in a DTF memory device with sub-micron pixel size and with nm scale thickness differences as fabricated by using the FIB milling. The FIB "write" process has the advantage of producing a high resolution memory structure with multi-thickness levels by a single FIB milling.

The ions utilized in the FIB process are accelerated to a suitable energy level. Different milling depths may be achieved by varying the ion dose in the FIB process. Individual data locations, or pixels, may vary in size and the depth of each pixel takes on one of a number of discrete levels, as achieved by changing the ion dose in the FIB process. For example, DTF optical memory structures with 16 physical levels or 4 bits/pixel may be fabricated providing an equivalent storage density in excess of 5 Gb/in2 which is more than double the density of present digital versatile disc ("DVD") devices. Since FIB technology is capable of producing an ultra-small ion beam (as small as eight nm), using FIB it is possible to produce ultra-high density data storage structures on dielectric thin film. This storage technology provides a potential data density of 5 Tb/in2 when combined with near-field detection technology.

The FIB fabrication process is simple and clean, without the problem of photoresist residues experienced in memory structures utilizing multiple metal film stacks fabricated using deposition and lift-off process. Contrary to metal thin film stack pixels, the DTF optical memory pixel related precision of film thickness can be readily controlled by the FIB milling time. The absolute film thickness is not critical and can be readily controlled because the use of reference pixel areas together with the data area in the same disk can be used to calibrate the reader light source and detector responsivity to establish the reference pixel color levels in the "reader color space". The DTF structure is much simpler to fabricate than multi-layer structures, which need to bond layer after layer in a complex process which is costly and which can reduce the yield rate.

Furthermore, It should be realized that, further discrete "colors" may be formed by stacking a plurality of transmissive layers having a selected thickness, each transmissive layer separated by a separation layer. Such a multiple layer DTF device provides a plurality of reflective interfaces along a vertical direction that is normal to substrate with different level of separations (and thus multi-bit data) between them. The multiple interfaces cause electric-magnetic wave interference along the wave propagation direction over a broadband, thereby creating a different intensity for different wavelengths in either reflection or transmission mode. A higher data storage capability may be realized by focusing a desired EM band onto a selected transmissive layer ("data bearing elements") to obtain the "colors" for that layer.

Additional advantages and other novel features of the invention and the process will be set forth in part in the description that follows and in part will become apparent to those skilled in the art upon examination of the following or may be learned with the practice of the invention or the process as described herein. As will be realized, the invention and the process are capable of other different embodiments, and their several details are capable of modification in various, obvious aspects all without departing from the invention or the process. Accordingly, the drawings and descriptions will be regarded as illustrative in nature and not as restrictive.

BRIEF DESCRIPTION OF THE FIGURES

The accompanying drawings incorporated in and forming a part of the specification illustrates several aspects of the present invention and process, and together with the description serve to explain the principles of the invention and process. In the accompanying drawings.

DETAILED DESCRIPTION OF THE INVENTION

Reference will now be made in detail to a present illustrative embodiment of the invention and process, examples of which are illustrated in the accompanying drawings, wherein like numerals indicate corresponding elements throughout the figures of the drawings.

This invention introduces a new structure for optical memory devices utilizing reflection of a broad band light source from the DTF structure and a process for creating such DTF structure. In the illustrative process, DTF optical memory structures may be fabricated in the manner comprising a positive Gallium ion ("Ga+") focused ion beam (FIB) micromilling on $SiO_2$ that is thermally grown on Silicon (Si) substrates in a method that is known in the art, though the fabrication process may be performed utilizing different ions in the FIB process on different thin films and/or substrates. Such Ga+ ions are accelerated to an energy level of 30 keV, though other energy levels may be suitable.

Figure 1:
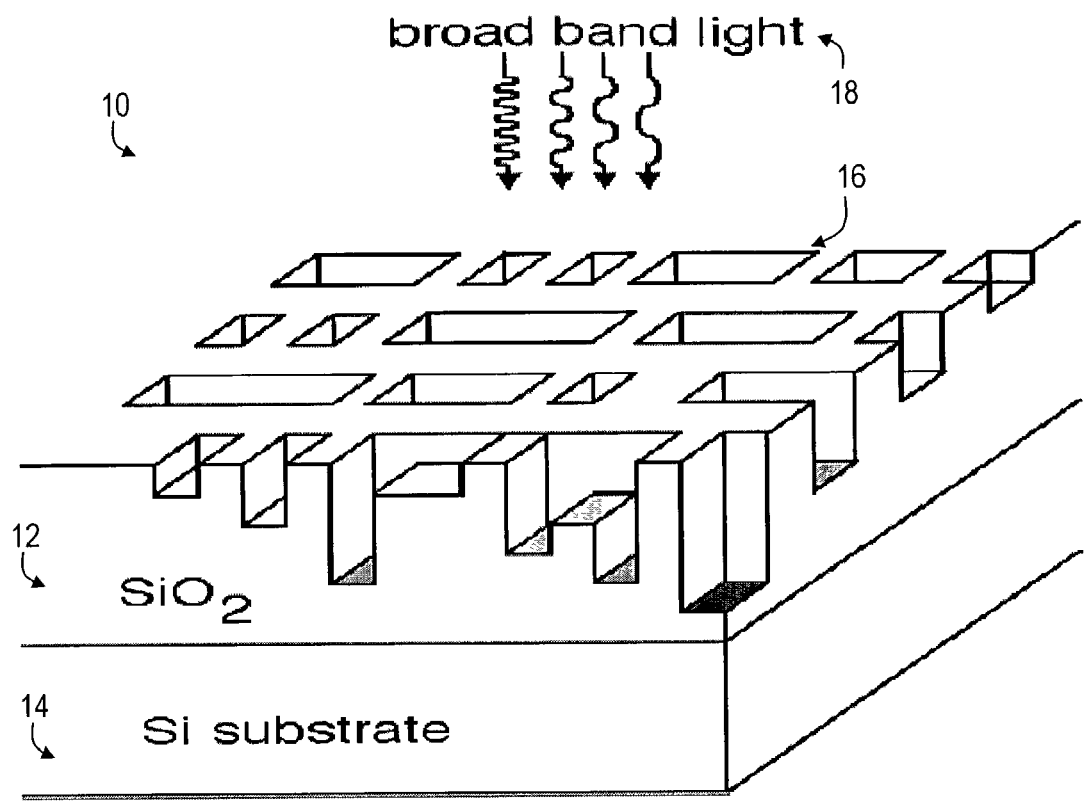
FIG. 1 is a graphic illustrating a DTF optical memory device structure utilizing a dielectric thin film silicon dioxide ($SiO_2$) layer grown on a Si substrate in a manner that is known in the art. The $SiO_2$ film is micro-milled to different discrete depth levels using a focused ion beam (FIB).

FIG. 1 illustrates generally at 10 the illustrative embodiment of the DTF color optical memory device comprising a dielectric thin film $SiO_2$ layer 12 grown on a Si substrate 14, though different films and/or different substrates may also be used. The $SiO_2$ layer 12 is approximately 800 nm thick, though other thickness may be utilized. The DTF color optical memory device 10 utilizes localized regions (i.e., DTF memory structures or pixels) 16 of varying film thickness to adjust the spectral characteristic of reflected light from a broadband light source 18. The $SiO_2$ film 12 is micro-milled to different discrete depth levels using FIB. The DTF optical memory device 10 operates on the properties of thin film interference and superposition of light at multiple wavelengths as each are already known in the art. The DTF device 10 also takes advantage of the multiple wavelengths contained in broad band light. By using a broad band light source 18, the reflected output is the superposition of many interference results of different wavelengths. The final result of these properties is to create an effective color for each pixel location as a function of film thickness, incident light spectral profile and the spectral responsivity of the detector.

Although the FIB micromilling accurately produces the device 10, it will be appreciated that other processes may be employed to produce a master copy or to produce copies from a master copy. For example, an FIB micromilled master copy may be used to stamp out or electrode plate a secondary copy.

Figure 2:
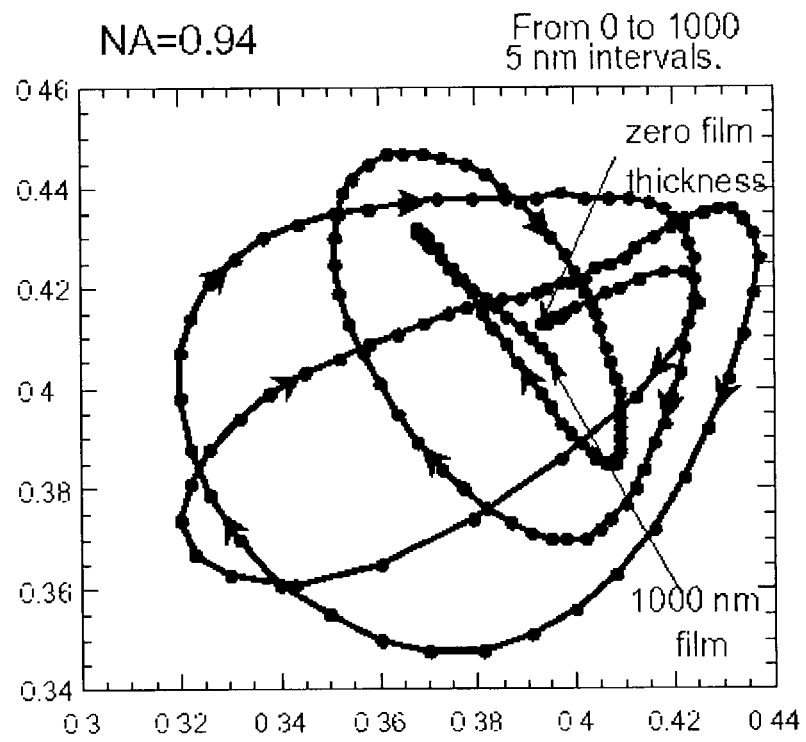
FIG. 2 is a graph illustrating the computational color coordinates on a standard Commission Internationale de l'Eclairage color system ("CIE") diagram of a film pixel with $n_{Si}$=3.5, $n_{SiO2\ film}$=1.46, $n_{air}$=1 structure. Different thickness films of the DTF optical memory device (increasing in five nm increments) are detected under a tungsten light source using a NA=0.94 objective. The CIE system characterizes colors by a luminance parameter Y and two color coordinates x and y which specify the point on the chromaticity diagram.

The capacity of the DTF structure to produce a large variety of colors is illustrated in FIG. 2. In FIG. 2, the CIE color coordinates are computed for a DTF structure when the dielectric layer varies from zero (0) to 1000 nm thickness in five (5) nm increments.

Figure 3:
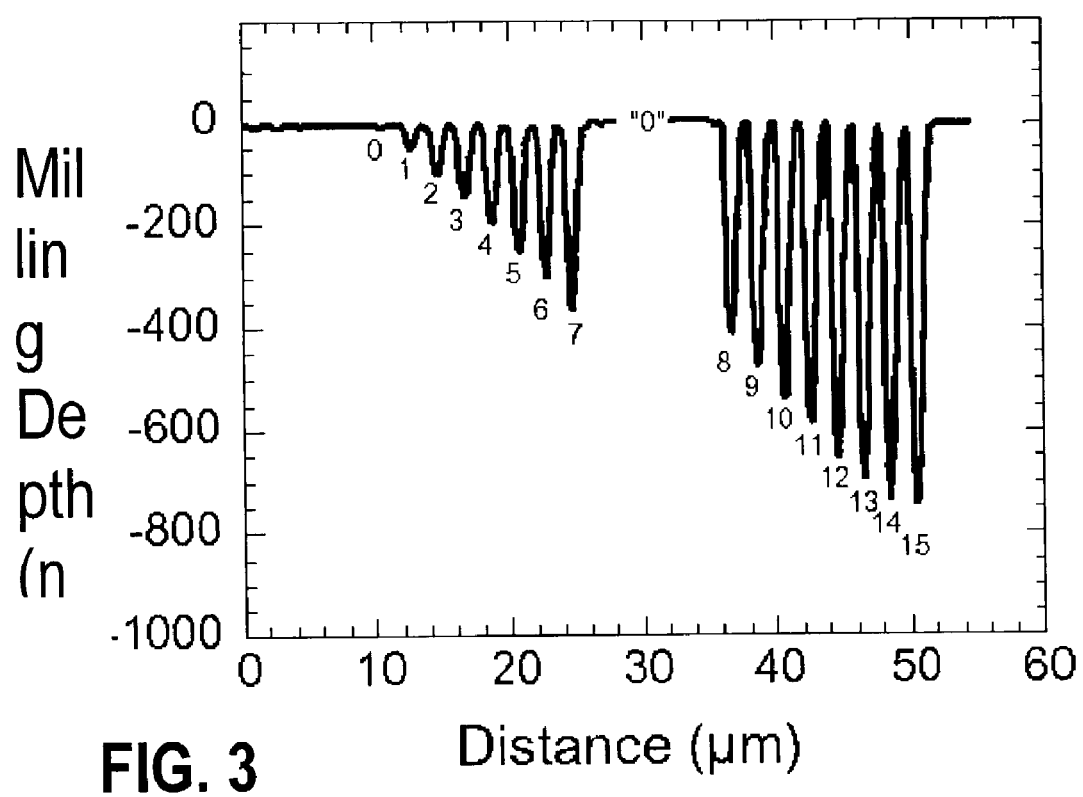
FIG. 3 is a graphic illustrating an atomic force microscopy ("AFM") line-scan profile of a DTF device. The profile shows 16 discrete levels produced by FIB milling. The horizontal linear distance between pixels ("pixel pitch") in this profile is approximately one micron.

FIG. 3 shows the resulting staircase-style milling profile of DTF structures that have been fabricated by Ga+ FIB milling on thin film $SiO_2$ that has been thermally grown on Si, as measured by atomic force microscopy (AFM). Different milling depths are achieved by varying the Ga+ dose. In the illustrative process, the depth of each pixel takes on one of 16 levels, from zero (0) to nearly 800 nm. This is achieved by changing the Ga+ dose from 0.35 $nC/\mu m^2$ for level 1 to 5.2 $nC/\mu m^2$ for level 15. Preferably, the milling rate is approximately 310 $\mu m/sec$ (or 0.144 $\mu m^3/sec$) using 1 nA of current. The remaining film thickness at any one point is given by the subtraction of the original film thickness from the milling depth.

Figure 4B:
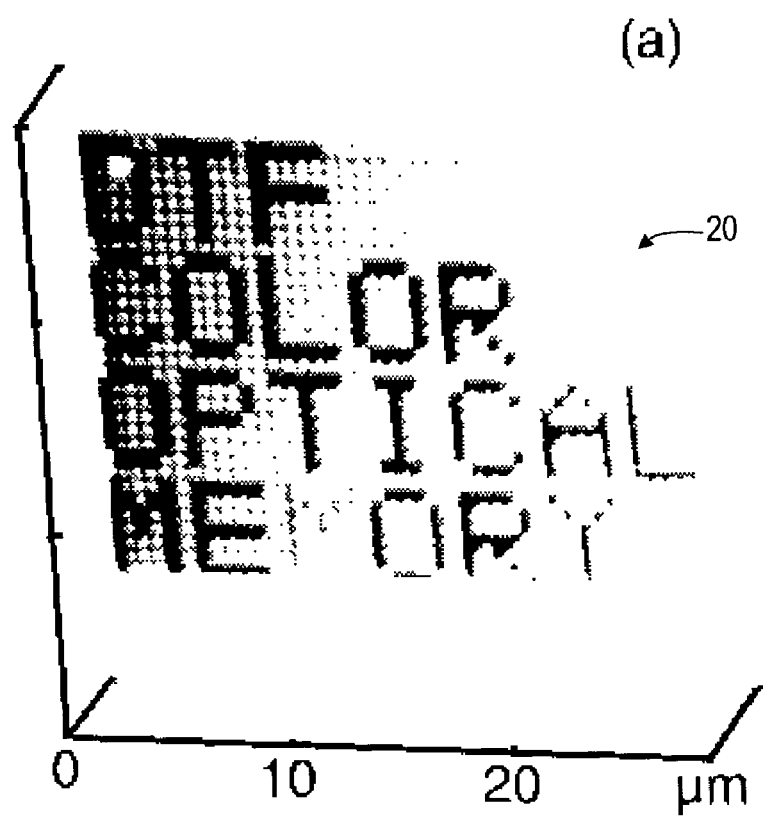
FIGS. 4A–4B depict a graphic illustrating AFM array images of two fabricated memory array devices. The first DTF structure array is a 41×31 array with pixel pitch of 700 nm and 16 milling levels; the second DTF structure array is a 16×16 array with 256 milling levels.
Figure 4A:
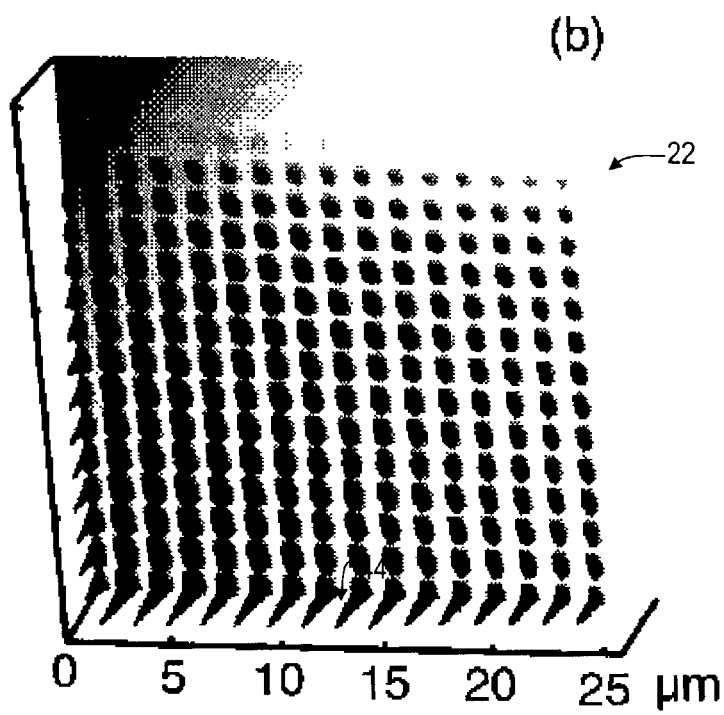

FIG. 4 shows two examples of fabricated DTF arrays with different milling depth and size. The first DTF structure array 20 is a 41×31 pixel array with a pixel pitch of 700 nm and with each pixel having one of 16 milling levels; the second DTF structure array 22 is a 16×16 pixel array with each pixel having one of 256 milling levels. In the first array 20, because each pixel is capable of having one of 16 different discrete values as determined by the color of the reflected light from the pixel, it is digitally equivalent to a four-bit pixel. The second array 22 has 256 different milling levels so each pixel is capable of one of 256 discrete values as determined by the color of the reflected light from the pixel; therefore, each pixel in this array is digitally equivalent to an eight bit pixel. By properly selecting the incident light profile and the detector responsivity for the specific film thickness set, color differences between milling levels can be enhanced thereby increasing the maximum number of colors detectable.

Figure 5:
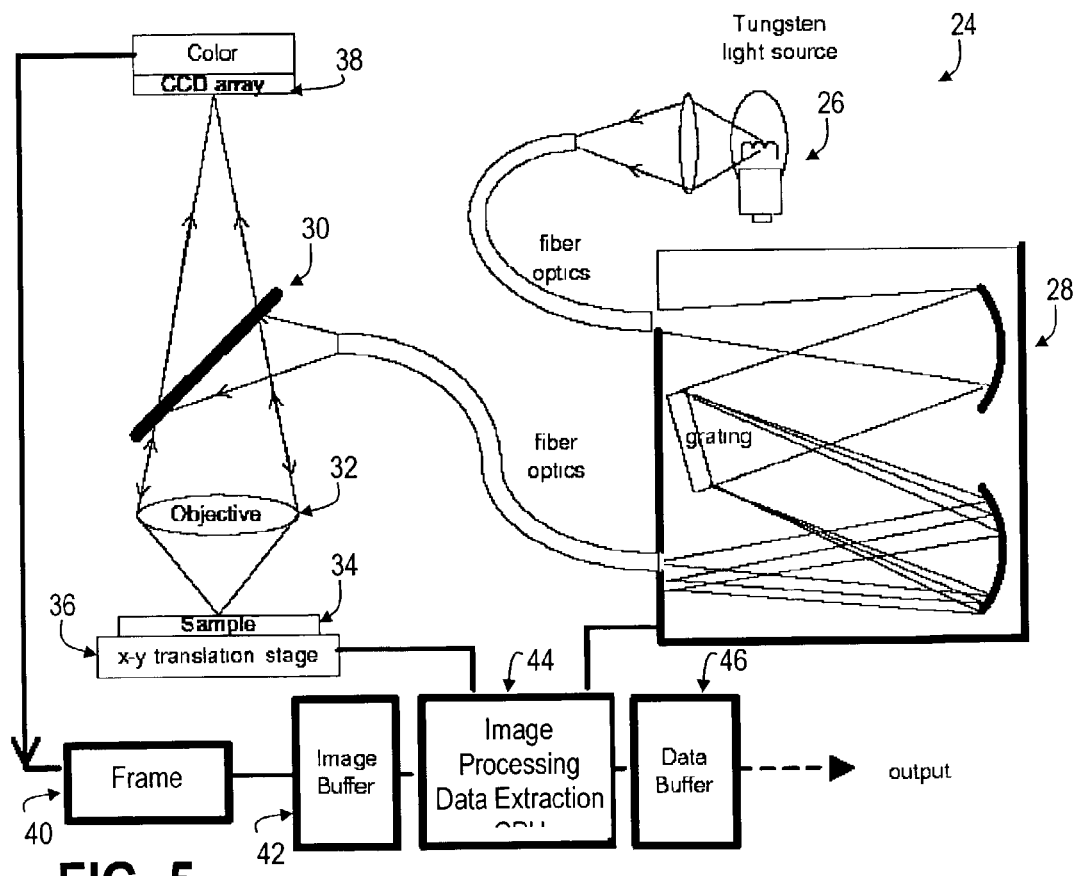
FIG. 5 is a drawing showing the detection of the DTF optical memory device using a broad band light source, detector array, and image processing/data extraction processor.

FIG. 5 illustrates a readout processor 24 of the DTF color optical memory device 10 utilizing a broad band light source, depicted as a tungsten light source 26, that is wavelength scanned by a monochromator 28. The DTF memory device is based on the interference effect of many different wavelengths. In the interference process, different wavelengths create different reflection peaks in thin film of varying thickness. If the location of reflection peaks or valleys is known, it can be used to obtain the thin film thickness and to extract the data stored in it. In this method, the color difference is not important at all; the only thing important is the relative intensity for each wavelength.

The selected light wavelength from the monochromator 28 is reflected off a half mirror 30 through an objective lens 32 and focused onto a DTF sample 34 at a position selected by an x-y translation stage 36. The reflected light returns through the objective lens 32, with a portion of the reflected light passing undisturbed by the half mirror 30 to be focused onto a color CCD array 38. The relative strength of the image at each x-y location on the sample 34 is read by the CCD by a corresponding intensity pattern that may be compared to a threshold level to receive a binary result. Combining this result with the binary result from other wavelengths creates a digital code for each pixel location on the sample 34 that corresponds to a discrete color. Determining this discrete color is achieved by having a frame grabber 40 that stores the binary result frame for all of the pixels read by the CCD array 38 at the selected wavelength. The binary result frames are then stored in an image buffer 42 until the full sweep is performed. An image processing data extraction central processing unit (CPU) 44, which also controls the x-y translation stage 36, determines the discrete color of each pixel based on the data in the image buffer 42. The full result of the pixels read are then stored in a data buffer 46 for further output processing (e.g., conversion to digital data encoded as discrete pixel colors).

The color information can be extracted by using filters attached to the detector array 30 or by optical scanning with a series of narrow bandpass filters. The read-out of multi-bits per physical location effectively implements parallelism in the vertical direction and provide the benefits of reduced average data access time and higher data throughput rate. Together with a color CCD array detector, 3-dimensional parallel reading by using CCD matrices of different types provides very high data rate and higher spatial resolution as compared with other technologies. In addition, the detectors may be sensitive to non-optical (i.e., invisible to the human eye) wavelengths of the electromagnetic spectrum (e.g., UV, IR, microwave).

It will be appreciated by those skilled in the art having the benefit of the present disclosure that the readout device 24 advantageously detects color information using a low-cost, high-speed wavelength scanning, monochromatic approach. However, other devices capable of detecting "color" may be implemented within the scope of the present invention. Other 3D optical memory devices such as multi-layers, holographic, volumetric storage approaches which make themselves incompatible to near-field technology by storing data deep inside the structure. By contrast, the DTF optical memory structure stores data on the surface of a thin film, and is not only compatible to existing technology for far-field detection but also compatible to near-field detection. The overall data density depends on both lateral density and vertical density. The high lateral data density increasingly necessitates using near-field technology. While providing multiplied data capacity for traditional far-field detection, the DTF memory approach combined with NSOM technology will provide the highest data density possible.

Figure 6:
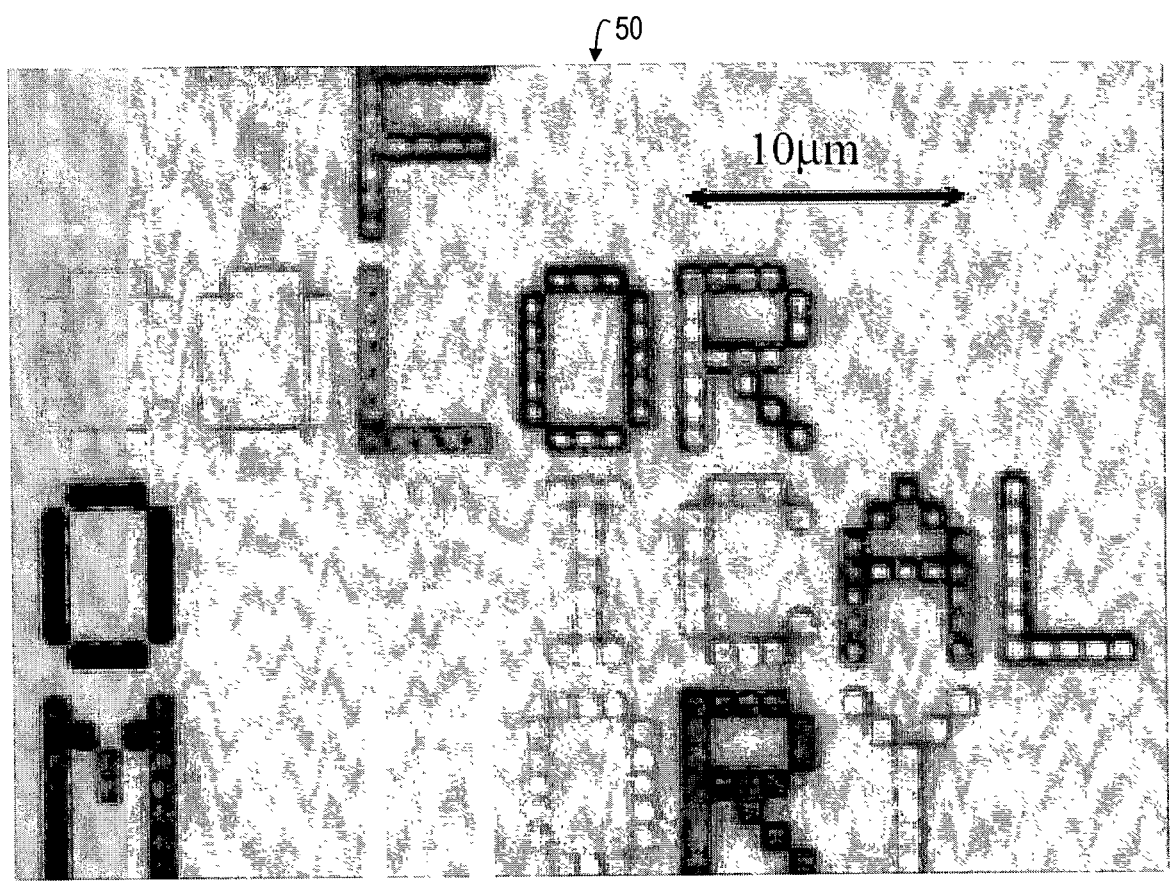
FIG. 6 is a reflected light color photograph of a fabricated DTF memory device taken using a 100×objective lens and a CCD camera. The 16 depth levels of the DTF memory structure in this figure produced 16 distinct colors.

FIG. 6 shows an example of the reflected light image of a DTF memory array 50. This image illustrates easily discriminated color levels and the suitability of using optical means to extract the stored data. Furthermore, this image provides another important aspect of the DTF memory device 10 in that it is capable to create microcolor digital pictures directly in the memory device. This property may have numerous functions, including data security. In this array 50, the embodiment is a DTF optical memory structure 10 with sixteen physical levels, including the unmilled film 20 thickness. The milling depth is randomly assigned to each letter. The sixteen milling levels results in a DTF optical memory device 10 of four bits/pixel providing an equivalent storage density in excess of five Gb/in2 which is more than double the density of present digital versatile disk ("DVD") devices. Since FIB technology is capable of producing an ultra-small ion beam (as small as eight nm), it is possible using FIB to produce ultra-high density data storage structures on dielectric thin film. This storage technology provides a potential data density of up to two Tb/in² when combined with near-field detection technology.

By generating multiple colors instead of gray scale, the data is stored in the illustrative embodiment in color coordinates instead of intensity. In this approach, the signal can be much stronger than the weak intensity signal generated in gray scale approach. This advantage increases the S/N ratio and has a reduced BER when compared to gray scale storage.

The absolute dielectric film thickness is not critical and can be readily controlled because the use of a reference pixel area together with the data area in the same disk can be used to calibrate the reader light source and detector responsivity to establish the reference pixel color levels in the "reader color space."

The use of an inorganic dielectric thin film in the illustrative embodiment eliminates the persistent problem associated with colorant aging which reduces the lifetime span of an optical memory device. The illustrative embodiment of the DTF structure, using an $SiO_2$ thin film 12 on a Si substrate 14, is able to endure harsh environments, including radiation. Furthermore, the illustrative embodiment may withstand high temperatures of up to 1000° C., without destruction of the memory.

We have illustrated the basic DTF device building block in three regions with two interfaces between the three regions. Specifically, what is depicted is a first region (e.g., air or vacuum) that lies above the device 10. A second region of a dielectric, transmissive material of (i.e., dielectric layer 12) is depicted as having one of several discrete levels that bear data information. A third region is depicted as a substrate 14. An interface exists between regions 1 and 2 and between regions 2 and 3 that causes reflections of an incident electromagnetic wave. In addition to an electromagnetic wave comprising the visible optical band, the principle data storage structure and data extraction method can be extended toward UV, IR, X-ray, or microwave band using the same electric-magnetic wave interference principle, except the change of materials that suitable for that specific electric-magnetic wave band. It will be appreciated that considerable freedom exists for choosing suitable materials. As an illustrative but not all-inclusive list, materials such as sapphire, GaN, UV grade glass, etc. may be suitable for a UV illumination. Materials such as glass, polycarbonate may be used for visible light. Materials such as glass, silicon, polysilicon, etc. may be suitable for IR illumination. Materials such as metal (e.g., gold, silver, and copper) may be suitable for X-Ray illumination. Furthermore, depending on whether the data storage structure is to be used under reflection mode or transmission mode, the substrate used can be either absorptive or transparent for the given electric-magnetic wave band. If not for transmission mode detection, the restriction of substrate to be used can be further extended to any material such as any kind of metals, dielectric materials, semiconductors, organic or inorganic materials as long as the interface between the dielectric material and the substrate forms a good reflection for that electric-magnetic wave band.

It should be realized that another aspect of the DTF device is to create two reflective interfaces (i.e., "thin film") along a vertical direction normal to substrate with different level of separations (and thus multi-bit data) between them. Broadband illumination along the vertical direction causes electric-magnetic wave interference along the wave propagation direction creates a different intensity for different wavelengths in either reflection or transmission mode. A data storage capability is realized with an array of miniature elements to store data.

Figure 7:
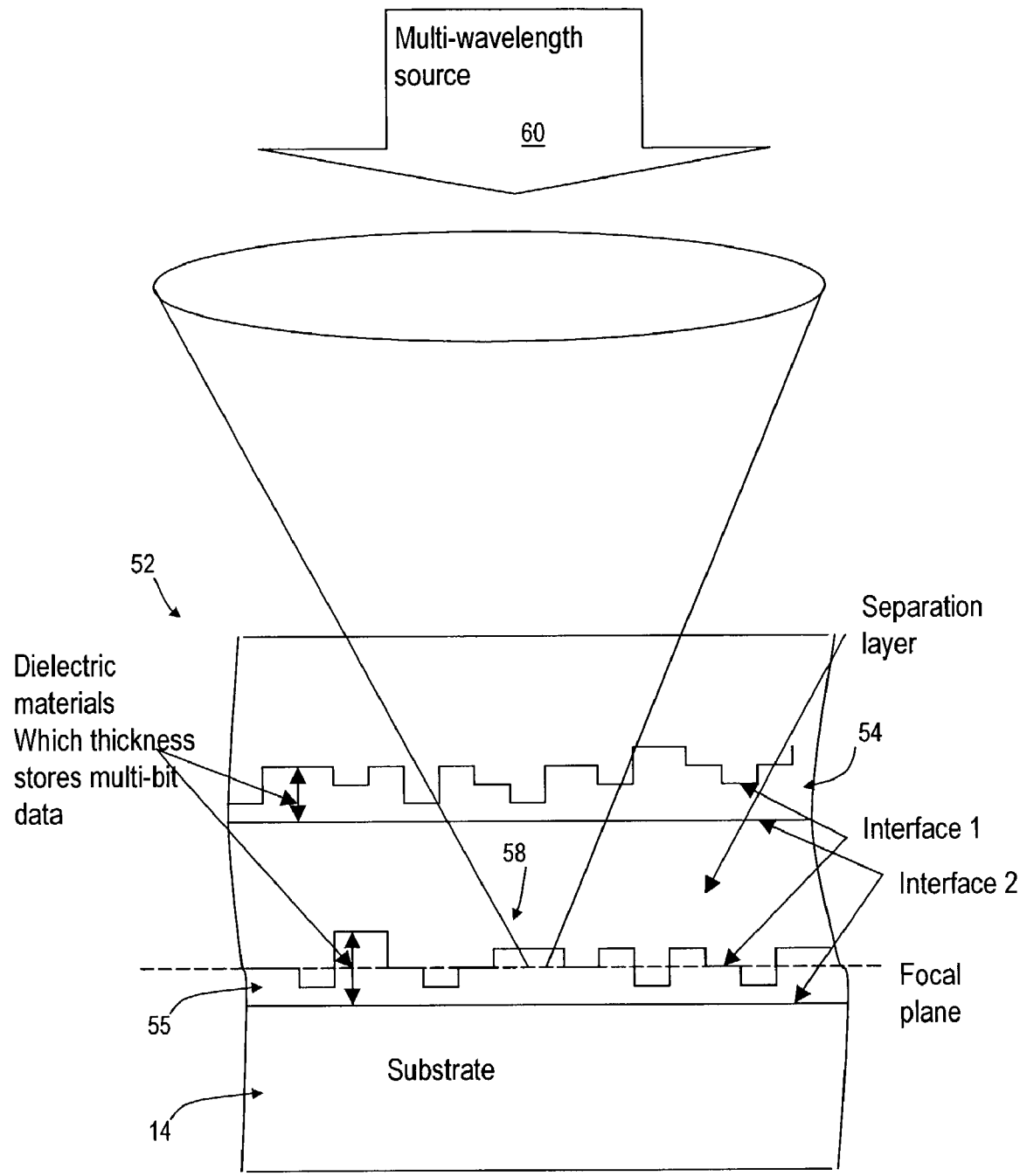
FIG. 7 is a graphic illustrating a multiple thin film version of DTF memory device having an interference pattern to produce a sensed spectra in a selected electro-magnetic wave band (e.g., UV, IR, visible, X-ray).

FIG. 7 depicts extending this approach to a multi-layer DTF memory device 52 that includes a plurality of separated thin films 54, 56 at each DTF structure 58. In particular, a broad band illumination 60 (e.g., X-ray, UV, IR, microwave) is focused to a desired depth (e.g., onto the data bearing layer 56) to obtain the "colors" of the selected layer, and thereby the data stored therein.

An advantage of using DTF storage method in a non-human detectable electromagnetic wave band that is machine-readable is a significant increase in application security check and authentication. The construction of machine readable color space is analog to the construction of a standard CIE diagram: a set of filters (at least two, usually three, and could more than three) sensitive to a portion of the operational electromagnetic wave band. The relative intensities obtained from the detectors after the filtering of the electric-magnetic wave is used as the "color coordinates" for that set of filters as the analog of CIE coordinates and thus define the color space of a machine when it is operated in a non-human detectable electric-magnetic wave regions.

It will be appreciated that the interference intensity change cycles in a given wavelength span is proportional to thin film refractive index, wave number and thin film thickness. Thus, in a longer wavelength electromagnetic band, fewer cycles of the electromagnetic wave will be produced for a given distance. Thus, when operating in IR or microwave region, the step thickness between discrete dielectric thin film thicknesses may tend to increase as compared to the visible band. Thus, the data density in vertical direction may tend to decrease. Similarly, the diffraction limit sets the lateral focus spot size, which is proportional to wavelength. Thus, the lateral resolution tends to decrease as well with increased wavelength. However, the longer wavelength may be desirable for example in applications where security is more important than data density. By contrast, operating toward the UV region allows reducing the vertical thickness step in DTF structure in proportional to the reduction in wavelength and thus increasing the vertical data density. The lateral data element spot size will also be reduced together with the reducing of vertical depth. In this situation, the data density will increase in proportion to $(1/\lambda)^3$.

In summary, the DTF optical memory device 10 and process for creating the device have been introduced. This device utilizes a nontraditional approach to increase the density of optical memory. A broad band light source is used instead of a laser to read the data. The fabricating process is performed using FIB micromilling of a film on a substrate.

The result yields multiple color levels due to light interference effects in dielectric film regions with varying thickness.

The foregoing description of the illustrative embodiment of the invention and the fabrication process have been presented for the purposes of illustration and description. They are not intended to be exhaustive or to limit the invention or process to the precise forms disclosed. Obvious modifications or variations are possible in light of the above teachings. The embodiment and process were chosen and described in order to best illustrate the principles of the invention, its practical application and its fabrication process to thereby enable one of ordinary skill in the art to best utilize the invention and process in various embodiments and with various modifications as are suited to the particular use contemplated. For example, although an advantage FIB micromilling process is described, it will be appreciated that other processes may be used to achieve the desired number of surface thicknesses to achieve the multi-bit pixel capability.

What is claimed is:

1. A device for digital thin film multiple-bit storage of data comprising:
    a substrate comprising a semiconductor wafer having a surface;
    a dielectric film having a silicon dioxide layer, contacting the substrate at the surface to form a dielectric interface;
    a plurality of localized regions in the dielectric film having one of selected plurality of thicknesses, each thickness configured to produce a discrete color when illuminated by a multi-spectral light.

2. The device of claim 1, wherein the semiconductor wafer comprises silicon, the dielectric film comprises a thermally grown silicon dioxide layer.

3. The device of claim 1, wherein the plurality of localized regions are formed by focused ion beam micromilling.

4. The device of claim 3, wherein the focused ion beam comprises a beam of positively charged gallium ions from $0.35$ $nC/\mu m^2$ to $5.2$ $nC/\mu m^2$.

5. The device of claim 1, wherein the discrete color comprises a color visible to a human eye.

6. The device of claim 1, wherein the discrete color comprises a machine readable spectra selected from a group of electromagnetic band consisting of ultra-violet, infra-red and microwave.

7. An optical memory apparatus, comprising:
    a storage device comprising:
        a substrate comprising a semiconductor wafer having a surface, and
        a dielectric film having a silicon dioxide layer, contacting the substrate at the surface to form a dielectric interface,
        a plurality of localized regions formed in the dielectric film having one of selected plurality of thicknesses, each thickness configured to produce a discrete color by thin film interference when illuminated by a multi-spectral light;
    a multi-spectral light source positioned to illuminate the plurality of localized regions; and
    a color detector positioned to detect the discrete colors from the plurality of localized regions.

8. The optical memory apparatus of claim 7, wherein the storage device is positioned to detect light transmitted through the substrate.

9. The optical memory apparatus of claim 7, wherein the storage device is positioned to detect light reflected back from the substrate.

10. The optical memory apparatus of claim 7, wherein the multi-spectral source comprises a selectable wavelength monochromator, the apparatus further comprising a wave scanning controller configured to illuminate the storage device with a selected wavelength, to store the intensity of light from each localized region, and to determine the discrete color for each localized region based on the respective intensities for the scanned wavelengths.

11. The optical memory apparatus of claim 7, wherein the plurality of localized regions are formed by focused ion beam micromilling.

12. The optical memory apparatus of claim 7, wherein the discrete color comprises a color visible to a human eye.

13. A method of optical data storage at a plurality of local regions on a surface of a semiconductive wafer comprising an optically transmissive silicon dioxide layer on a substrate, comprising:
    defining a plurality of discrete layer thicknesses selected to achieve a unique optical color by thin film interference when illuminated by a multi-sprectral light source; and
    producing a selected discrete layer thickness at each local region.

14. The method of claim 13, wherein producing a selected discrete layer thickness further comprises:
    forming a silicon dioxide optically transmissive layer on a silicon substrate; and
    micromilling each local region with a focused ion beam to the selected discrete layer thickness.

15. The method of claim 14, further comprising:
    micromilling each local region with a focused ion beam of positive gallium ions from $0.35$ $nC/\mu m^2$ to $5.2$ $nC/\mu m^2$.

16. The method of claim 13, further comprising:
    defining a reference area on the surface;
    defining a pattern including each of the plurality of discrete layer thicknesses; and
    forming the pattern on the reference area for calibration purposes.

17. The method of claim 13, wherein the unique optical color is visible to a human eye.

18. The method of claim 13, wherein the discrete color comprises a machine readable spectra selected from a group of electromagnetic band consisting of ultra-violet, infra-red and microwave.

19. A method of optical data retrieval from a plurality of local regions on a surface of a semiconductive wafer comprising an optically transmissive silicon dioxide layer on a substrate, the method comprising:
    illuminating each local region with a multi-spectral light;
    detecting a color produced by each local region when illuminated by the multi-spectral light;
    assigning the detected color from each local region to one of a plurality of discrete colors contained on the surface.

20. The method of claim 19, further comprising:
    selecting a plurality of discrete light spectra sufficient which comprise the multi-spectral light to differentiate the plurality of discrete colors contained on the surface;
    detecting a light intensity from each local region in response to sequential illumination with each of plurality of discrete light spectra; and
    correlating the plurality of light intensities for each local region to one of the plurality of discrete colors.

21. The method of claim 20, wherein the surface includes a reference area containing a pattern of the plurality of discrete colors for optical calibration, and wherein selecting the plurality of discrete light spectra further comprises detecting the discrete color for each local region in the reference area.

22. The method of claim 19, wherein detecting the color produced by each local region comprises detecting the color transmitted through the surface.

23. The method of claim 19, wherein detecting the color produced by each local region comprises detecting the color reflected from the surface.

24. The method of claim 19, the method further comprising:

decoding the detected plurality of discrete colors into a binary data representation.

25. The method of claim 24, wherein the surface comprises a master, the method further comprising:

optically writing the decoded binary data representation onto an optical storage surface to produce a copy readable by a laser optical reader.

26. The method of claim 19, further comprising:

filtering the color produced by each local region to selected one of a plurality of narrow color bands for detection.

27. The method of claim 26, further comprising spatially separating a simultaneous plurality of narrow bands for detection by a corresponding plurality of detectors.

28. The method of claim 26, wherein filtering the color produced by each local region to selected one of the plurality of narrow color bands for detection comprises sequential filtering for sequential detection by a detector.

29. The method of claim 19, wherein the color is visible to a human eye.

30. The method of claim 19, wherein the discrete color comprises a machine readable spectra selected from a group of electromagnetic band consisting of ultra-violet, infra-red and microwave.

* * * * *